United States Patent [19]
Torok et al.

[11] Patent Number: 5,587,943
[45] Date of Patent: Dec. 24, 1996

[54] NONVOLATILE MAGNETORESISTIVE MEMORY WITH FULLY CLOSED FLUX OPERATION

[75] Inventors: James Torok, Minneapolis, Minn.; Richard Spitzer, Berkeley, Calif.

[73] Assignee: Integrated Microtransducer Electronics Corporation, Berkeley, Calif.

[21] Appl. No.: 388,035

[22] Filed: Feb. 13, 1995

[51] Int. Cl.⁶ ............................................. G11C 11/15
[52] U.S. Cl. ............................... 365/158; 365/173
[58] Field of Search ............................. 365/158, 171, 365/173; 360/113, 119

[56] References Cited

U.S. PATENT DOCUMENTS

| | | | |
|---|---|---|---|
| 2,911,627 | 11/1959 | Kilburn et al. | 365/55 |
| 4,780,848 | 10/1988 | Daughton et al. | 365/173 |
| 5,173,873 | 12/1992 | Wu et al. | 365/173 |
| 5,251,170 | 10/1993 | Daughton et al. | 365/158 |
| 5,432,734 | 7/1995 | Kawano et al. | 365/158 |
| 5,442,508 | 8/1995 | Smith | 360/113 |
| 5,477,482 | 12/1995 | Prinz | 365/129 |

FOREIGN PATENT DOCUMENTS

WO87/00959  2/1987  WIPO.

OTHER PUBLICATIONS

Pratt, W. P., et al., "Perpendicular Giant Magnetoresistances of Ag/Co Multilayers," *Physical Review Letters*, 66(23):3060–3063 (Jun. 1991).

Parkin, S. S. P., et al., "Oscillatory Magnetic Exchange Coupling through Thin Copper Layers," *Physical Review Letters*, 66(16):2152–2155 (Apr. 1991).

Jones, K., "Texas Instruments Plans Large Expansion," *The New York Times* (Aug. 20, 1993).

Callaby, D. R., et al., *Solid State Memory Study Final Report*, Technical Report No. RE-0013, National Media Lab, St. Paul, MN (Feb. 1994).

National Media Laboratory Spring Review on Solid–State Memory Technologies, *Proc. 1994 Spring Conference on Solid–State Memory Technologies*, Pasadena, CA, (May 23–25, 1994), pp. 3–8, 97, 121, 123–133.

Harrison, R. W., "Laser Scanning Surface Profilometer," *IBM Technical Disclosure Bulletin*, 13(3):789–790 (Aug. 1970).

Hylton, T. L., et al., "Giant Magnetoresistance at Low Fields in Discontinuous NiFe–Ag Multilayer Thin Films," *Science*, 261:1021–1024 (Aug. 1993).

Berkowitz, A. E., et al., "Giant Magnetoresistance in Heterogeneous Cu–Co Alloys," *Physical Review Letters*, 68(25):3745–3748 (Jun. 1992).

Zhang, S., "Theory of Giant Magnetoresistance in Magnetic Granular Films," *Appl. Phys. Lett.*, 61(15):1855–1857 (Oct. 1992).

*Primary Examiner*—Joseph A. Popek
*Attorney, Agent, or Firm*—Townsend and Townsend and Crew LLP

[57] ABSTRACT

A memory cell including a storage element having a first structure with a plurality of layers, selected layers having magnetization vectors associated therewith, the first structure exhibiting giant magnetoresistance, wherein the storage element has a closed flux structure in at least one dimension, and wherein the magnetization vectors are confined to the at least one dimension during all stages of operation of the storage element. The memory cell includes a means for reading information from and writing information to the first structure and a selection conductor for applying one or more selection signals to the storage element to enable reading from and writing to the first structure. In one embodiment, the reading and writing means includes a read conductor electrically coupled to the first structure, and a write conductor electrically isolated from the read conductor and the first structure. In a second embodiment, the reading and writing means is a single conductor electrically coupled to the first structure.

68 Claims, 7 Drawing Sheets

VIEW A-A

NONVOLATILE MAGNETORESISTIVE MEMORY WITH FULLY CLOSED FLUX OPERATION

BACKGROUND OF THE INVENTION

The present invention relates primarily to nonvolatile, magnetic, solid-state memories which employ the principles of magnetoresistance. An overview of solid-state memory technologies—including electrical, magnetic, optical molecular, chemical, and biological—is given by Ashton in the Proceedings of the "Conference on Solid-State Memory Technologies", Pasadena, Calif., 23-25 May 1994, and by Ashton et al. in "Solid-State Memory Study", Technical Report RE-0013, National Media Lab, February 1994, both of which are incorporated herein by reference. The present invention relates furthermore to an array of memory cells, each cell including storage, read, and write elements. More specifically, the magnetic storage elements of the present invention employ a closed-flux structure and operate without the magnetization being rotated away from the direction of the flux closure. This results in several advantages discussed herein.

Magnetic mass storage devices with moving disk or tape are commonplace in the computer industry. A description of such magnetic storage devices, as well as some of the operational problems and limitations are described in U.S. Pat. No. 5,237,529, the entire specification and claims of which are incorporated herein by reference. Although such magnetic mass storage devices provide substantially permanent storage of information, they typically have relatively long access times, are sensitive to shock and vibration, and have tribological constraints, i.e., wear and friction.

Thin-ferromagnetic-film random-access memories are nonvolatile and have fast random access. Ferromagnetic film memories in the 1960 era used inductive readout. Inductive readout has been abandoned because the signal becomes too small when the element is miniaturized. Modern magnetic film memories use anisotropic magnetoresistive readout. Anisotropic magnetoresistance (AMR) is proportional to the square of the sine of the angle between current and the magnetization vector. Readout requires the magnetization vector to be rotated so that a component is perpendicular to the rest position. Closed-flux operation would require closing the flux in two orthogonal directions around insulated word and digit conductors, a problem that has never been solved. Consequently, such memories are operated with flux closure in one direction only, and rotate the magnetization into a nonclosed configuration. This leads to many difficulties such as information loss due to magnetization creep, high current-drive requirements, and low signal. This is discussed in U.S. Pat. No. 5,251,170 to Daughton and Pohm, the entire specification of which is incorporated herein by reference. The smaller the film element, the greater the demagnetizing field, and the greater the difficulties.

Giant magnetoresistance (GMR) is very different from AMR. GMR can be an order of magnitude larger than AMR, and it appears only in inhomogeneous materials, especially layered structures. For GMR, the change in resistance is proportional to the cosine of the angle between the magnetization in one region and the magnetization in the other. This is different from the AMR sine of twice the angle between the current and the magnetization. Consequently, in GMR the maximum signal difference occurs when the magnetization of one layer is changed by 180 degrees. With AMR this produces no change. Thus, with a GMR memory element, it is possible to operate with the magnetization restricted to one axis, and flux closure only along that axis is required.

GMR (sometimes called the spin valve effect), is discussed in a number of patents, mostly for the application of read heads for disks or for magnetic field sensors. Dieny et al. (U.S. Pat. Nos. 5,159,513 and 5,206,590) discuss a GMR sensor consisting of two magnetic layers separated by a thin film of Cu, Au, or Ag. One of the magnetic layers is high-coercivity Co. The magnetizations in the two magnetic layers are perpendicular to each other for maximum sensitivity. Sakakima et al. (U.S. Pat. No. 5,243,316) discusses the materials for an improved GMR element for magnetic sensing and for thin-film heads. In this patent, the high-coercivity material is Co-rich FeCo, and the low-coercivity material is Ni-rich NiFeCo. Cain et al. (U.S. Pat. No. 5,301,079) describes a read head in which two low-anisotropy magnetic films with easy axes aligned are separated by a current-bearing nonmagnetic conducting film. Current in that nonmagnetic film rotates the magnetization in the two layers in opposite directions to achieve maximum sensitivity to fields from domains in a disk. Saito et al. (U.S. Pat. No. 5,304,975) discusses magnetoresistive sensors consisting of many periods of alternately stacked magnetic and nonmagnetic layers. Included is a layer to apply a magnetic bias to assist reversal.

A. V. Pohm and C. S. Comstock published a paper entitled *"Memory Implications of the Spin-Valve Effect in Soft Multilayers"* (J. Appl. Phys 69, 5760, 1991). Their discussion is of a GMR memory element having a sense-digit line perpendicular to a word line. The element has a closed structure in one axis only, and the magnetization is rotated out of the axis of flux closure by current in the word line. This results in higher current requirements and a risk of information loss through magnetization creep.

Kung et al. (U.S. Pat. No. 5,343,422) teach a GMR memory element. This comprises a substrate and a rectangular multilayered structure deposited thereon which includes two layers of ferromagnetic material separated by a layer of nonmagnetic metallic conducting material. The magnetization easy axes of the two magnetic films are parallel. The magnetization of one of the ferromagnetic layers is fixed, and the magnetization of the other is free to change direction between the "one" state and the "zero" state. This is done with two striplines, a word line and a sense-digit line. These two striplines are perpendicular to each other. This invention has no provision for closed-flux structure; instead it relies on the width of the element being so small that it cannot support a domain wall, so each individual film cannot become demagnetized. In addition, each individual memory element has two semiconductor gates, so the elements don't ever have to suffer half select pulses. One disadvantage of having two gates per element is the cost in real estate per element. The total capacity per chip is diminished.

Semiconductor random access memory (RAM) is also well known to those of skill in the art. RAM generally comprises a set of memory cells integrated on a chip with a number of peripheral circuits. RAMs are described in, for example, Porat et al., *Introduction to Digital Techniques*, John Wiley, 1979, the entirety of which is incorporated herein by reference. In general, RAM circuits perform several functions, including addressing (selection of specific locations for access), providing power, fanout (transmission of a signal to a multiplicity of loads), and conditioning required to generate a useable output signal. In RAM memories, the addressing scheme permits random access to the desired cell, with access time being independent of the cell location. Selected portions are then extracted for use. RAMs are generally fast enough to be compatible with a CPU, but they are generally too expensive to be used for mass storage. Further, both static RAMs (SRAMs) and dynamic RAMs (DRAMs) are volatile in the sense that their contents are lost when the power to the memory is lost. DRAMs also require periodic refreshing. It is not practical, therefore, to use either DRAMs or SRAMs for long-term storage.

Electronically programmable read only memory (EPROM) and read only memory (ROM) are nonvolatile alternatives to RAM. However, while such memories do not require a refresh cycle, they have the obvious disadvantage of being programmable only once. Other nonvolatile semiconductor memories that can be written repeatedly, such as electrically alterable read only memory (EAROM) or electrically erasable read only memory (EEROM), or FLASH (an application-optimized EPROM), do not provide nearly the reliability of magnetic memories for long-term storage.

From the foregoing, it is evident that an improved memory which provides the random access, speed, and ruggedness of RAMs, but is nonvolatile and does not require either a standby or periodic-refresh power source is desirable for permanent storage applications.

SUMMARY OF THE INVENTION

According to the present invention, a memory cell is described which employs a multilayer storage element exhibiting giant magnetoresistance. The structure of the storage element is such that a closed flux path is effectively maintained during the entire operation of the memory cell including write operations and nondestructive readout.

Anisotropic magnetoresistance (AMR) corresponds to a difference in resistivity when current flows parallel to the magnetization of a material rather then perpendicular to the magnetization. Anisotropic magnetoresistance has been employed in various ferromagnetic thin-film memories. A recently discovered magnetoresistive effect is known as giant magnetoresistance (GMR). GMR is a different effect than AMR in that AMR can occur in homogeneous bulk samples, whereas GMR occurs only in layered or inhomogeneous structures. GMR occurs where the magnetization direction varies from layer to layer. The GMR effect may be twenty or more times larger than the AMR effect. Moreover, a memory-cell design optimized for AMR readout is not optimized for GMR, and a design optimized for GMR may produce no AMR signal at all.

Giant magnetoresistance is used in the structure and methods of various embodiments of the present invention. The giant magnetoresistive effect is employed for memory applications, specifically as a read sensor, a storage element, and an all-metal spin transistor. Several advantages are realized by the embodiments of the present invention employing giant magnetoresistance which are due in part to the fact that the giant magnetoresistive effect in multilayered thin films has been found to be more than twenty times larger than the conventional anisotropic magnetoresistive effect exhibited by bulk materials and single-layered thin films.

According to one embodiment of the invention, a memory cell includes a multilayer storage element exhibiting giant magnetoresistance. The storage element has a closed flux structure in at least one dimension, the magnetization vectors in the various layers being substantially confined to the at least one dimension during all stages of operation of the storage element. The memory cell includes a means for reading information from and writing information to the storage element, and a selection conductor for applying a selection signal to the storage element, thereby enabling reading from and writing to the storage element. In a more specific embodiment, the reading and writing means includes a read conductor electrically coupled to the first structure, and a write conductor electrically isolated from the read conductor and the first structure. In a second specific embodiment, the reading and writing means is a single conductor electrically coupled to the first structure.

In accordance with another embodiment of the present invention, an array of submillimeter transducers (sensors/actuators), each comprising a multilayer giant magnetoresistive element which also serves as storage, is formed with support electronics on a chip, or as a hybrid. This permanent random access memory (PRAM) comprises an addressable array of submillimeter information cells, each of which contains a magnetic storage element, a write element, and a read element on a single substrate, each storage element having a closed-flux structure. An addressing scheme provides random access to any individual cell with access time substantially independent of the cell's location in the array. The PRAM thereby combines the permanent storage capability of magnetic memory with the ruggedness and speed of semiconductor memory. The individual transducers are activated at specifically related positions and times by switching circuitry employing, for example, conventional row/column addressing, for reading from or writing to the storage elements.

The device of one embodiment of the present invention comprises a giant magnetoresistive readout element, herein referred to as a "GMR transducer". According to a specific embodiment of the invention, data reads are performed by a combination of (i) suitably interconnected submillimeter GMR transducers capable of sensing the state of the giant magnetoresistive storage elements, and (ii) electronic switching to activate selected individual GMR transducers. The spatial points at which the transducers are activated are the ones corresponding to the memory locations that are to be read. The times at which the selected GMR transducers are activated can be chosen to be substantially the same so that an entire block of data may be accessed at a time.

As mentioned above, the use of materials which display giant magnetoresistance (i.e., multilayered thin films) increases the magnitude of the readout signal for each individual memory element resulting in several advantages. First, larger readout signals allow for the construction of larger arrays. They also allow for a larger number of bits to be read out using a single sense line. Moreover, because of increased signal to noise ratio, a faster readout may be achieved. In addition to these advantages, giant magnetoresistance is feasible over a wide temperature range of operation.

Perhaps the most important advantage of giant magnetoresistance is that it allows complete flux closure at all times and during all stages of memory-cell operation. In other words, there is no demagnetizing field during either write or read operations. This is not true for memories employing AMR. With a GMR element, the maximum resistance change or signal occurs when the magnetization of one of the layers changes by 180 degrees. Thus it is only necessary to close the flux around one axis, not two. The results are (i) no demagnetizing field, (ii) no disturb problems due to magnetization creep, (iii) low drive requirements, and (iv) large signal.

The present invention is superior to disk and tape systems because it has qualitatively shorter access time, significantly greater resistance to shock and vibration, higher reliability, maintenance-free operation, the absence of head crashes, and is self aligning. It is superior to DRAMs and SRAMs because it provides permanent storage. It is superior to FLASH because it is fully bit alterable, is faster, and has a virtually unlimited number of erasure cycles; the last advantage also being an advantage over MRAM.

A further understanding of the invention may be had with reference to the remaining portions of the specification and the drawings.

DESCRIPTION OF THE SPECIFIC EMBODIMENTS

CONTENTS

Figure 1A:
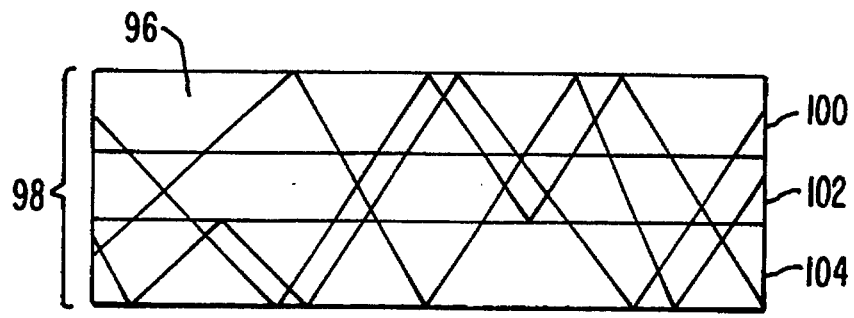
FIG. 1a shows a simple GMR three-layer film in which the top and bottom layers are magnetic and the middle layer is a nonmagnetic conductor. The paths of various electrons are shown for the case in which the magnetization of the top and bottom layers is parallel.

I. Definitions
II. Memories with Anisotropic Magnetoresistance (AMR)
III. Material Displaying Giant Magnetoresistance (GMR)
IV. GMR PRAM Including Soft Square-Loop Ferrite
V. Toroidal PRAM Element With Axis Normal to Substrate
VI. PRAM Element With Closure Axis Parallel to the Substrate
VII. Ultra-Small PRAM Element With Vertical GMR
VIII. Fabrication
IX. Representative Applications
X. Conclusion

I. Definitions

As used herein, the following terms are intended to have the following general meanings:

"Activation" refers to the steps of addressing a transducer and the operation of a transducer to perform its selected function. In the specific case of giant magnetoresistive cells, activation refers to addressing and sensing of the resistivity of the cell, which will vary depending upon magnetization.

"Anisotropic magnetoresistance" (AMR) refers to the anisotropy in resistance some conductive magnetic materials exhibit as a function of the angle between the electric current in the material and the magnetization vector. The anisotropic magnetoresistive component of the resistance is proportional to the square of the sine of that angle.

"Coercivity" refers to the applied external field in the direction opposite the magnetization required to reduce the average magnetization of a material to zero. This is sometimes called the "coercive force" or the "coercive field".

"Giant magnetoresistance" (GMR) refers to the difference in the resistance that conduction electrons experience in passage through magnetic multilayer films, depending on the relative orientation of the magnetization in successive magnetic layers. This difference occurs because the scattering of conduction electrons depends on their spin orientations relative to the local magnetization. In general, the scattering is weaker and the resulting resistance is smaller when the magnetizations between successive layers are parallel. In particular, a multilayer film with two different magnetic layers separated by a nonmagnetic conducting layer has a resistance that is greater when the two materials are magnetized antiparallel rather than parallel.

"Information cell" means a PRAM cell containing a storage element, a write element, a read element, and supporting electronics.

"Magnetic transducer" means a transducer that creates magnetization for storing or senses magnetization fields for reading.

"Memory cell" means the same thing as "information cell".

"Solid-state memory" refers to a memory with no moving parts.

"Spin transistor" means a GMR-based switching device, the gate of which is activated by a magnetic field.

"Submillimeter" means micron-scale down to nanometer-scale.

"Thin-film technology" refers to the formation of electronic elements (by, for example, vacuum evaporation or sputtering) on a supporting substrate.

"Transducer" means a device used to sense or measure a physical quantity (e.g., pressure, magnetic field, moisture, etc., of a system) and/or activate or impress a physical quantity on a system. Among micron-scale and submicron-scale transducer systems used according to specific embodiments of the invention are arrays of transducers used to sense a characteristic of a coupled magnetic material so as to detect the presence or absence of a data bit and to activate the magnetic material so as to impress the presence or absence of a data bit.

II. Memories with Anisotropic Magnetoresistance

A permanent random access memory (PRAM) is a random access memory that does not require either standby or periodic-refresh power to retain its data. A PRAM may be constructed that uses anisotropic magnetoresistance (AMR), which has been known and used in film memories for some time. AMR requires only one film, not a multilayer, and the difference in resistance occurs for the magnetization parallel to the current direction vs. perpendicular to the current direction.

The creation of a memory element with a closed-flux structure in only one dimension is much less difficult than the creation of a memory element with a closed-flux structure in two dimensions. If the magnetization vectors of the memory element are confined to one dimension (e.g., parallel and antiparallel), then a one-dimensional closed structure is sufficient. Unfortunately, the anisotropic magnetoresistance signal requires rotating the magnetization substantially 90 degrees, thus requiring closure in two dimensions if a closed-flux structure is desired.

An open structure causes incomplete switching and bad disturb problems in a film memory. See, for example, Gerald Granley, Proc. 1994 Spring Conference on Solid-State Memory Technologies, May 23–25, Pasadena, Calif., p. 97, for an account of such disturb problems causing an AMR memory to fail after 100,000 cycles. Such gradual disturb failures are known as magnetization creep. This is an ultraslow mode of switching that has a lower threshold than either coherent magnetization rotation or wall-motion switching. It takes many repeated pulses for a film to switch by magnetization creep. In particular, it takes a number of pulses having a hard-axis component in combination with an easy-axis field that is on when the hard-axis field is changing. The hard axis pulses cause the magnetization to rotate back and forth, and the easy axis field provides the energy difference that favors wall motion in one direction over another direction. At high densities, the demagnetizing field from any nonclosed flux geometry is huge and dominates other parameters. Adjacent bits will also contribute to creep if the flux structure is not closed.

There are some serious disadvantages to a memory design which requires the magnetization to be switched substantially 90 degrees from the direction of flux closure. Huge drive fields are required to overcome the shape anisotropy of the non-closed edges. Magnetization curling develops as discussed in U.S. Pat. No. 5,251,170 to Daughton and Pohm, causing loss of signal. The rotation of the magnetization causes magnetization creep which, in turn, causes the information in the cells to be lost. By contrast, if the magnetization is not required to deviate from the axis of flux closure, the memory elements should theoretically have as many error-free read/write cycles as ferrite core memories or conventional magnetic memories with disk drives. The latter are known to operate error-free for up to $10^{15}$ cycles.

A memory design based on AMR might work if GMR multilayer films were substituted for the single layer AMR films, but the design would not be optimum. In order to take full advantage of GMR, the GMR memory design should avoid rotation of the magnetization vector away from the flux closure axis, thereby reducing drive currents and avoiding disturb problems caused by magnetization creep.

III. Material Displaying Giant Magnetoresistance (GMR)

The recent discovery of giant magnetoresistance (GMR) is a revolutionary change in electronics. The GMR effect occurs in certain multilayer, ultrathin-film structures consisting of alternating layers of a magnetic metal and nonmagnetic metal. The films are on the order of a few hundred nanometers thick. Such multiple period, multilayer GMR films, where each period identically comprises several layers in order (L1/L2/ . . . /Lm), have been reported and studied parametrically. GMR tends to increase monotonically with the number of periods. Yamamoto et al [H. Yamamoto, T. Okuyama, H. Dohnomae and T. Shinjo, J. Magn. & Magn. Mat. 99 (1991) 243] found a GMR of 10% for the 4-layer, 15-period structure (NiFe/Cu/Co/Cu)×15, and Petroff et al [F. Petroff, A. Barthelemy, A. Hamzic, A. Fert, P. Etienne, S. Lequien and G. Creuzet, J. Magn. & Magn. Mat. 93 (1991) 95] found a GMR of 16% for (Fe/Cr)×18, both at room temperature.

GMR is a different effect than anisotropic magnetoresistance (AMR) which appears primarily in bulk materials. AMR has been known for many years, and is a much smaller effect than GMR. The origin of AMR is in the spin-orbit coupling in the atoms of the ferromagnetic material. It does not distinguish between parallel and antiparallel alignments. The change in resistance for GMR is proportional to the cosine of the angle between the magnetization vectors in adjacent magnetic layers. The resistance of the structure is larger when the top and bottom films are magnetized antiparallel than when magnetized parallel. This is true regardless of whether the current flow is parallel or perpendicular to the substrate.

The GMR values for any given multilayer structure depend on whether the current is passing parallel or perpendicular to the substrate. Magnetoresistance is expressed as a fractional change in the resistance. GMR is much larger when electrons travel perpendicular to the film plane than parallel to the film plane. Nevertheless, most studies have been done by using current parallel to the film plane. The reason is that resistance normal to the film plane is very low if the width-to-thickness ratio (form factor) of a memory element is very large. However, if sufficiently fine lithography allows fabrication of elements whose width is comparable to their thickness, then it is possible to realize memory elements with reasonable perpendicular-to-plane resistance and a much larger percentage change in GMR than for in-plane resistance. AMR is approximately a one-percent effect, depending on the material. In-plane GMR offers a readout signal an order of magnitude larger than AMR. This makes the readout signal much larger, allowing less expensive electronics and—because of higher signal-to-noise ratio—faster readout than in AMR-based designs. GMR perpendicular to the plane is even larger than in-plane GMR.

GMR has very attractive properties for memory applications. The layered films can be made to function as a storage element by having them switch independently. In a specific embodiment of the invention, the layered films are made to switch independently by having successive magnetic layers with different compositions, coercivities and anisotropy fields; having successive layers exchange coupled with a weak enough exchange coupling to allow their independent switching; and having the nonmagnetic conducting layer be very close to just the right thickness to ensure a sufficiently strong exchange coupling between the magnetic layers to reset the lower-coercivity film when the current in the word line is discontinued. Thus, the coercivity of the low-coercivity layer was chosen to be sufficiently lower than that of the high-coercivity layer thereby allowing the low-coercivity layer to switch at a lower field.

Figure 1B:
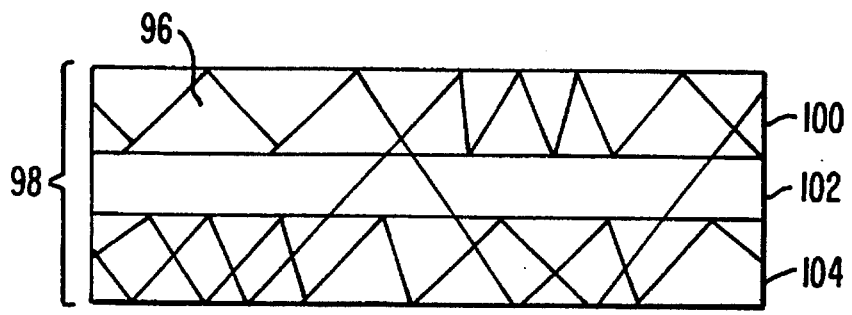
FIG. 1b shows the three-layer film of FIG. 1a wherein the magnetization of the top and bottom layers is antiparallel.

The simplest GMR multilayer film has three layers. FIGS. 1a and 1b show electron paths 96 in a simple triple-layer film 98 which demonstrates GMR. The center layer is a nonmagnetic conductor 102. The top film 100 and the bottom film 104 are ferromagnetic. In FIG. 1a the magnetization in the top and bottom films is parallel whereas in FIG. 1b it is antiparallel. In general, GMR films have N magnetic layers and at least N–1 nonmagnetic conducting layers, FIGS. 1a and 1b being a simple illustrative example.

Figure 2:
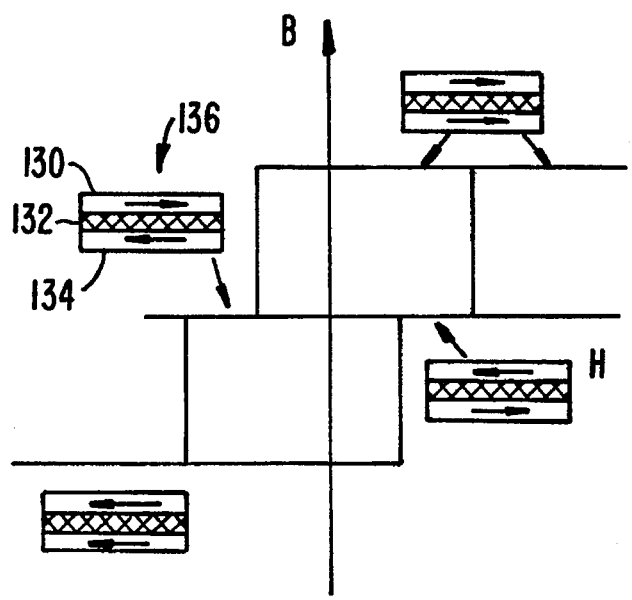
FIG. 2 shows the major hysteresis loop for a GMR triple layer film in which the two magnetic layers have a different coercivity.

FIG. 2 shows the major hysteresis loop of a GMR exchange-coupled triple-layer film. Two magnetic layers 130 and 134 are separated by a nonmagnetic layer 132. The two magnetic layers have coercivities that differ by more than the exchange coupling between them such that layer 130 has a high coercivity and layer 134 has a low coercivity. Film cross sections 136 show the magnetization at each part of the loop. Beginning at the upper right quadrant, both top and bottom layers 130 and 134 are saturated in the same direction. If the applied field K is reduced to substantially zero and then reversed in direction, the layer having the lower coercivity switches first, as shown by the cross section in the upper left quadrant. The switching occurs when the field is equal to the sum of the coercivity of the lower coercivity film plus the coupling field.

Still referring to FIG. 2, as the applied field H is increased in the negative direction, the film layer having a higher coercivity switches directions, as depicted in the lower left quadrant. This switching occurs when the field magnitude is equal to the coercivity of the higher-coercivity film less the value of the exchange coupling. Thus, switching is carried out in such films in a two-step process.

Figure 3A:
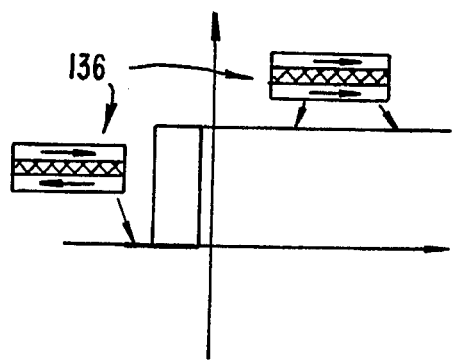
FIG. 3a shows a minor hysteresis loop for a GMR triple layer film corresponding to the "zero" state.
Figure 3B:
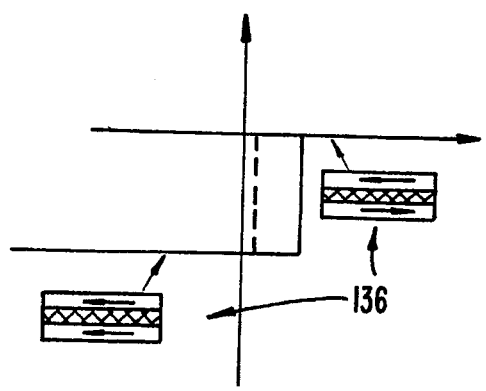
FIG. 3b shows a minor hysteresis loop for a GMR triple layer film corresponding to the "one" state.

An important feature in the embodiment employing exchange coupled GMR films relates to the minor hysteresis loops and the effect on nondestructive readout. FIG. 3a shows the minor loop when the high coercivity film 136 is magnetized to the right, to be known as the "one" state. In contrast, FIG. 3b depicts the minor loop when the high coercivity film 136 is magnetized to the left, to be known as the "zero" state.

Figure 4A:
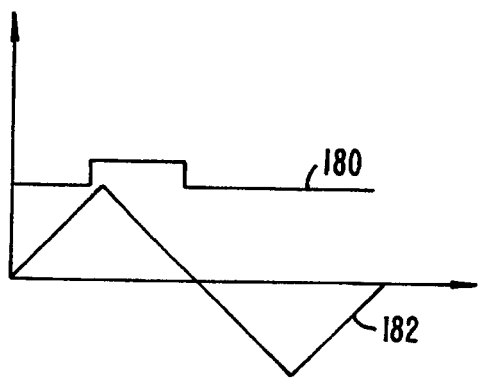
FIG. 4a shows the nondestructive readout signal from the "one" state of a GMR memory cell.
Figure 4B:
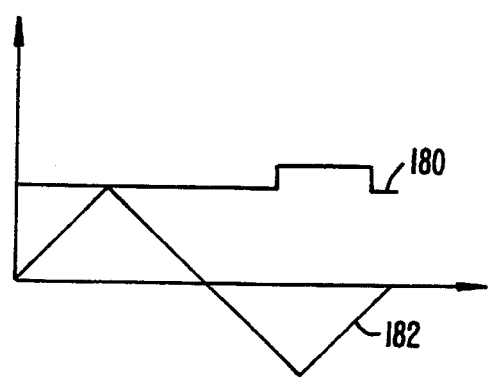
FIG. 4b shows the nondestructive readout signal from the "zero" state of a GMR memory cell.

Readout of memory cells designed according to the embodiment employing exchange-coupled GMR films is distinguished from readout employed in prior art magnetized thin films. In this embodiment the value of one selected bit along the sense line is determined in a nondestructive fashion by measuring the resistance change in response to the change in the magnetization obtained by applying a field from one of the word lines. The application of the field temporarily switches the lower-coercivity film; for this example, in which exchange bias exceeds the coercivity of the lower-coercivity layer, this film resets or switches back when the current in the word line is discontinued. Capacitive and inductive noise occur during the read cycle. These may be minimized through the use of dummy lines and differential sense amplifiers. Further noise rejection may be achieved by exploiting the difference in waveform of the sense signal. The induced noise has the same waveform as the word current. FIGS. 4a and 4b depict the resistive signals 180 when a triangular word current 182 is applied. FIG. 4a shows the signal corresponding to a "zero" state and FIG. 4b shows the signal corresponding to a "one" state.

Although the signal waveform will vary somewhat depending on the ratio of the exchange bias to the coercivity, the signal waveform will be different from the capacitive and inductive noise, and therefore electronically distinguishable.

Although GMR is generally observed in multilayered structures, it can also be found in suitable heterogeneous alloy systems consisting of single domain particles in a non or weakly magnetic matrix. One such alloy, Cu—Co, is discussed in Berkowitz et al., "Giant Magnetoresistance in Heterogeneous Cu—Co Alloys," *Physical Review Letters*, vol. 68, no. 25, Jun. 22, 1992 and Xiao et al., *"Giant Magnetoresistance in Nonmultilayer Magnetic Systems,"* Physical Review Letters, vol. 68, no. 25, Jun. 22, 1992, both of which are incorporated herein by reference.

IV. GMR PRAM Including Soft Square-Loop Ferrite

Figure 5:
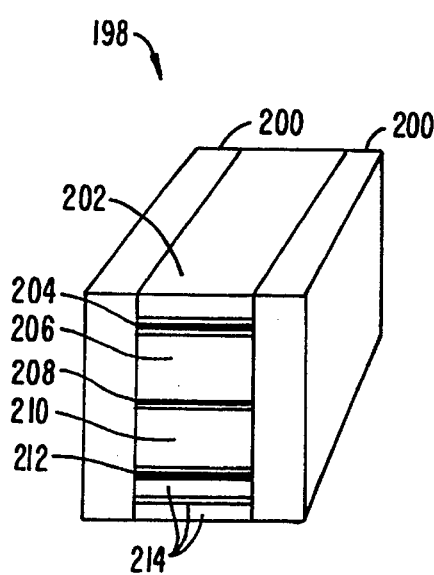
FIG. 5 shows a cut-away view of one embodiment of a GMR PRAM memory cell with a closed-flux storage element.

As discussed above, specific embodiments of the present invention employ giant magnetoresistance. FIG. 5 depicts one embodiment of a cell using a giant magnetoresistive sensing multielement film. From FIG. 5, it is seen that memory cell 198 is generally rectangular in geometry, with two legs comprising soft ferrite 200, one leg comprising permalloy 202 for flux closure, and the fourth leg comprising a giant magnetoresistive multilayer 214. Use of soft square-loop ferrite for storage allows for low drive currents, less than a milliamp, and faster readout than from an oblique ferrite. According to the invention, the four legs of the memory cells are in a closed-flux design analogous to an old-fashioned core memory element. The film may be magnetized in a clockwise or in a counter-clockwise manner around the core. Traversing through the core are two strip-lines deposited on the film, comprising a word line 206 and a digit line 210. Layers 204, 208, and 212 are insulation layers. A sense line (not shown) is electrically coupled to the magnetoresistive multilayer 214 and isolated from both the word line 206 and the digit line 210.

Figure 6:
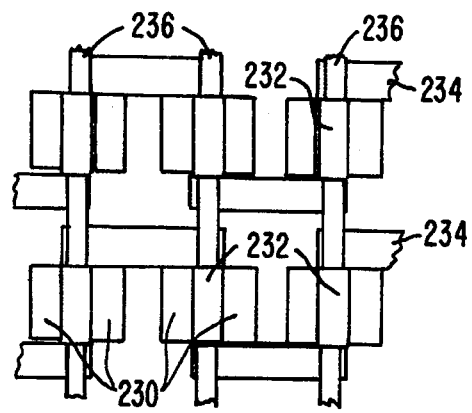
FIG. 6 shows six of the GMR PRAM storage elements of FIG. 5 and their associated word and digit lines (sense lines are not shown as they are under the digit lines)

FIG. 6 depicts six GMR memory cells in an array. The cells are depicted with soft ferrite elements 230 and permalloy layers 232. Word lines 236 and digit lines 234 are shown, but the sense lines are not shown because they are hidden by digit lines 234. In this embodiment, the digit line and the sense line are distinct.

It is significant in this embodiment of the present invention that the giant magnetoresistance of the structure changes when the magnetization in the two layers changes from parallel to antiparallel. In obtaining a readout of the memory cell of this embodiment, a half-select current on the word line that intersects the cell to be read is applied. Such a current should not be strong enough to switch the cell, but will be effective to reverse the low-coercivity film of the multilayer giant magnetoresistive film if and only if the field from the pulse is opposite to the magnetization existing in the cell.

In accordance with this embodiment of the present invention, a bit is read as either a "one" or a "zero" by determining if the change in resistance occurs with a positive or with a negative word pulse. FIGS. 4a and 4b graphically depict such an operation. It should be noted that each word line crosses a particular sense line only once. Thus, during the word pulse, only one bit on the sense line has an associated change in resistance. Therefore, it is possible to have many bits on a given sense line and be able to read a selected bit at any time. Furthermore, because the readout is nondestructive in nature, if there are signal to noise problems, multiple pulses may be employed to extract information using well-known signal processing methods. Moreover, the waveform of a signal on a sense line is different than that of the word pulse. Accordingly, the signal can be distinguished from the capacitive noise on the word line. Dummy sense lines are preferably used wherein the signal of interest would be the difference between that from the desired sense line and that from the dummy line.

V. Toroidal PRAM Element With Axis Normal to Substrate

Figure 7:
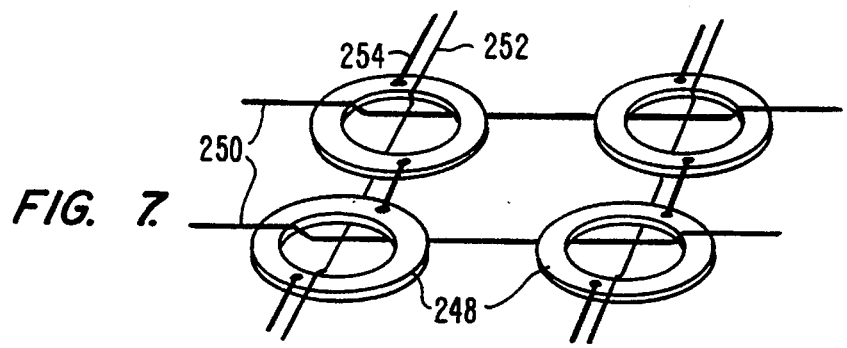
FIG. 7 shows a conceptual depiction of GMR PRAM memory cells in which the GMR element functions for both readout and storage.

Another embodiment of the present invention is shown conceptually in FIG. 7. This embodiment is a flattened toroid with axis normal to the substrate. The basic magnetic configuration is that of a core which has flux closure with no magnetic gaps around the ring. FIG. 7 shows four PRAM cells with their associated GMR cores 248, word lines 250, digit lines 252, and sense lines 254. The demagnetizing field prevents the magnetization from deviating significantly from the circumferential direction. The drive lines, like those of the old fashioned two-dimensional core memories, go through the center of the core. Unlike the old core memories, the sense lines 254 are electrically connected to the cores 248, which are composed of a material exhibiting giant magnetoresistance. This configuration would not work for materials exhibiting ordinary anisotropic magnetoresistive effects. In this embodiment, the GMR film functions as the storage element as well as the read element. It is the presence in GMR films of two magnetic materials, one of high coercivity and one of low coercivity, which allows such dual use.

The depiction of FIG. 7 is conceptual in that the magnetic film is preferably deposited on a flat unbroken surface, rather than onto the stepped surfaces of etched drive lines. Therefore the portions of the drive lines on the bottom of the magnetic cores are preferably bigger than the cores themselves. Also, in this embodiment, the upper portion of the drive lines connect to the bottom portions through the center of the core. This is depicted in FIG. 8.

Figure 8:
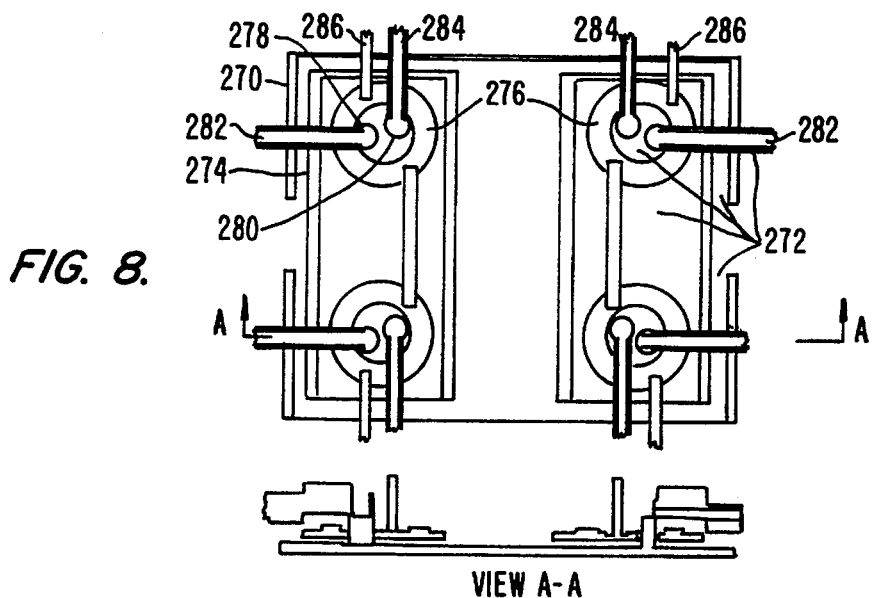
FIG. 8 shows conceptually how GMR PRAM elements can be connected to the word, digit, and sense lines so as to serve in the dual role of readout and storage.

An array of memory cells as shown in FIG. 8 is fabricated by putting the bottom portions of the word lines 270 down first. Next, one of the insulation layers 272 (under word lines 282) is put down and it is then etched. The bottom portion of the digit line 274 is then deposited and etched. Then one of the insulation layers 272 is deposited. The cores 276 are put down and each core is on a broad table defined by the intersection of the two bottom conductor layers 270 and 274. Then holes to the bottom layers (hole 278 goes to the bottom portion of the word line 270 and hole 280 goes to the bottom portion of the digit line 274) are etched. The upper portion of the word lines 282 and the upper portion of the digit lines 284 are fabricated, making connection to the bottom portions through the holes 278 and 280, respectively. Lastly, sense lines 286 are deposited. In all, there are seven deposition steps, four of metal layers and three of insulating layers. View A—A of FIG. 8 shows a cross section along the dashed line A—A. Fabrication is discussed in greater detail in one of the following sections.

Figure 9:
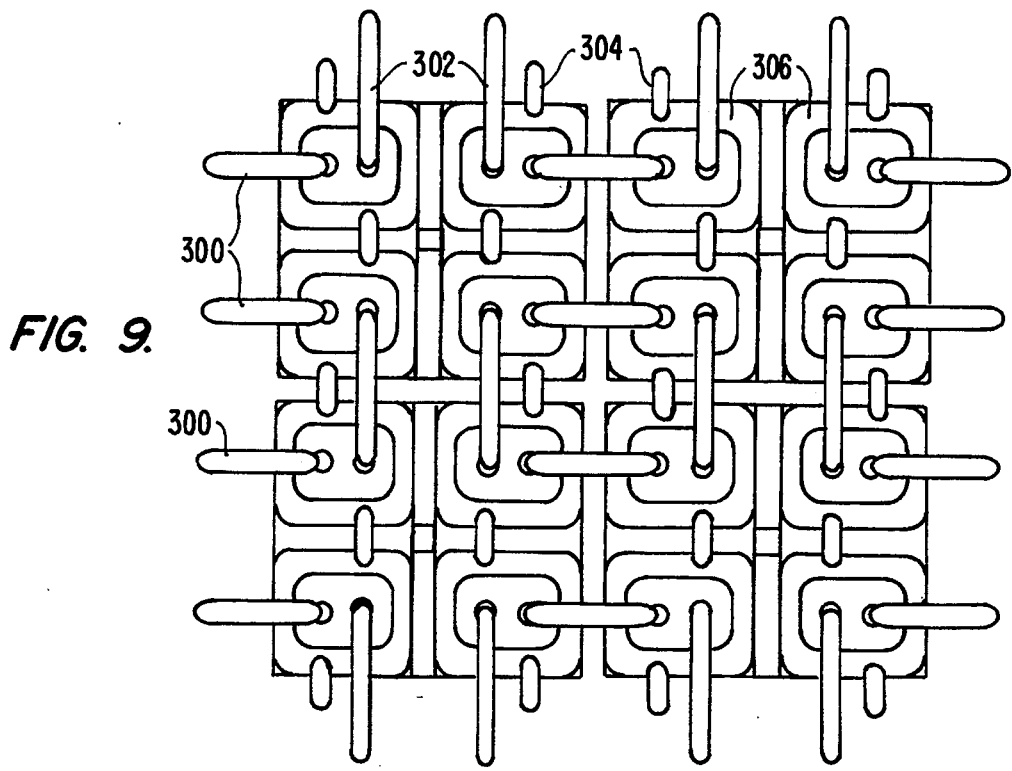
FIG. 9 shows the actual geometry of an array of sixteen GMR PRAM memory cells with dual-role GMR elements.

The actual geometry of an array of memory cells according to one embodiment of the invention is shown in FIG. 9. Sixteen GMR memory cells are shown with cores 306, word lines 300, digit lines 302, and sense lines 304. The cores can be packed together considerably tighter if they are made rectangular. If the minimum feature size that can be achieved in the photolithographic process is 1 μm lines on 2 μm centers, then the memory cells are on 6 μm by 8 μm centers. If the photolithographic resolution is ten times finer, then the center-to-center spacing of the memory cells and the current requirements also decrease by ten, and the memory density increases by 100. Given current progress in photolithographic techniques, minimum feature sizes on the order of 250 nm (or even 120 nm) should be possible within a relatively short time. Thus, the density of this memory is limited only by the limits of photolithographic techniques. Additionally, because of the complete flux closure, this memory array will not suffer the usual problems associated with magnetic film memories.

The current requirements of such memory cells are especially attractive. If the geometry is as described above (cells on 6 μm×8 μm centers), the two layers have coercivities of 2 Oe. and 5 Oe. respectively, and the coupling field is 1 Oe, then the maximum current in any line is 4 mA.

VI. PRAM Element with Closure Axis Parallel to Substrate

Figure 10:
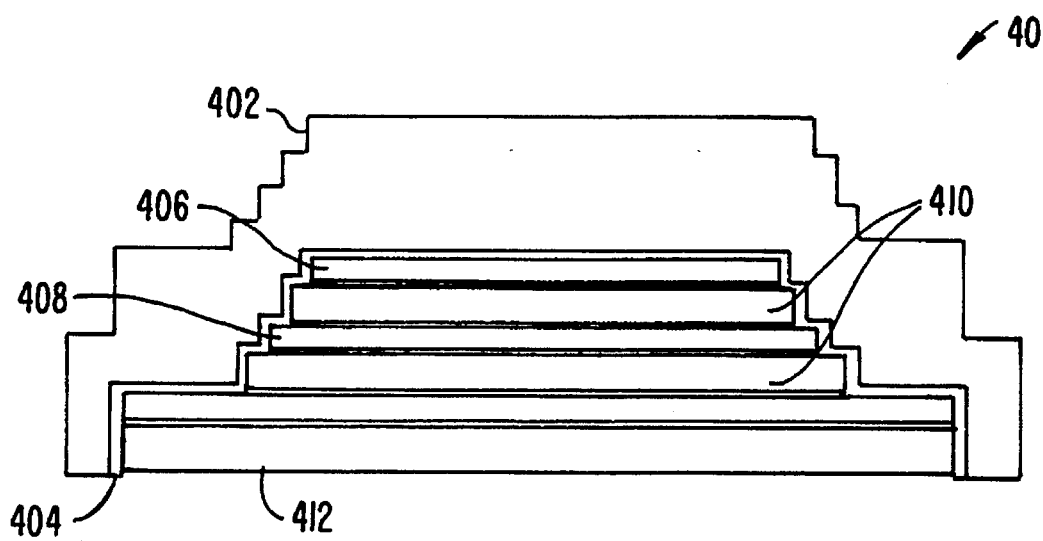
FIG. 10 shows a cross-section of a GMR PRAM cell fabricated according to one embodiment of the invention.

A GMR PRAM cell 400 which requires fewer fabrication steps and is more compact than that of FIG. 7 is shown in FIG. 10. The flux coupling passes from the bottom magnetic film 412 through a thin insulating gap 404 to the top film 402 and back again. The geometry is like a toroid flattened on its side. The axis is in the film plane. Because of this thin insulating gap, the flux closure is not as perfect as in the embodiment of FIG. 7. The type of coupling between magnetic films can be any combination of ferromagnetic coupling, antiferromagnetic coupling, or stray-field coupling.

Figure 11:
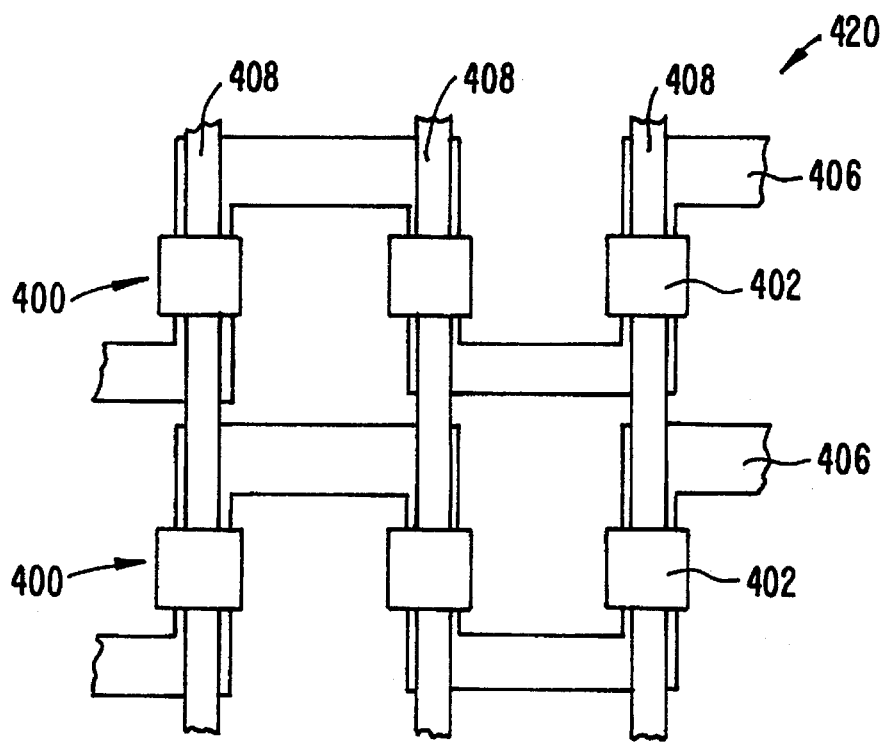
FIG. 11 shows a top view of a six-cell GMR array according to a specific embodiment of the invention.

PRAM cell 400 includes a permalloy keeper layer 402, an insulating film 404, a digit line 406, a word line 408, insulating layers 410, and a multilayer storage film 412 which exhibits GMR. Insulating film 404 separating GMR film 412 from permalloy keeper 402 needs to be as thin as possible without shorting the two metal layers. A thickness of 50 Å is preferred. Permalloy keeper 402 should be thick enough to complete the flux path from one end of storage film 412 around the strip lines to the other end of storage film 412. Its composition is somewhat iron rich to have slightly positive magnetostriction in order to avoid stripe domains and to have low coercivity. GMR multilayer film 412 is (NiFe/Cu/Co/Cu)×15. The sequence of depositions is as follows. The first deposition on the substrate is multilayer GMR film 412. After that, a layer of insulation 410 and two drive lines 406 and 408, separated by another layer of insulation 410, are deposited and patterned. The configuration of drive lines 406 and 408 is shown in FIG. 11 which illustrates an array 420 of six of the PRAM cells 400. The next step is a very thin insulating film 404 (approximately 50 Å) deposited on the assembly to separate GMR film 412 from permalloy keeper 402. Permalloy keeper 402 is the last deposited layer. The design shown in FIGS. 10 and 11 should be less expensive to produce, require less current, have higher density for a given mask-feature size, and have a readout voltage 10 times larger than a memory cell using AMR. A modification of this design is to replace the permalloy keeper 402 with a GMR multilayer film substantially identical to the storage element 412. The insulating gap 404 can then be eliminated.

Note from FIG. 11 that the two drive lines are parallel in this invention and not orthogonal. This is very important because orthogonal drive lines drive the magnetization away from the direction of flux closure. In the present invention, the flux is closed at all times.

VII. Ultra-Small PRAM Element With Vertical GMR

Superhigh PRAM densities can be achieved through the application of the highest-resolution tools now available and the all-metal spin transistor. A specific example of such a high-resolution tool, tip-based microscopes, is described next. The use of this example is not intended to be restrictive.

A. Scanning Probe Microscopes.

Scanning probe microscopes, with their ability to alter surfaces at the nanometer scale, offer the potential for data storage at extremely high densities. Two new approaches to digital memory that have been proposed [John Mamin, Proc. 1994 Spring Conference on Solid-State Memory Technologies, May 23–25, Pasadena Calif., pp 121–33] involve the scanning tunneling microscope (STM) and atomic force microscope (AFM). In these devices, a moving tip near, or in contact with, a surface is used to image/alter the surface during a read/write operation. The PRAM design shown in FIGS. 12–14 combines the extraordinary ability of these microscopes to structure features that are a few atoms wide with the operational and cost advantages of a solid-state memory. The very fine lithography enabled by such high-resolution tools can be used to make very large PRAM chips.

STM probes may also be fabricated in an array and employed as transducers in, for example, memory applications as described in U.S. Pat. No. 5,237,529, already incorporated herein by reference.

The limitations on the characteristics of an in-plane GMR PRAM array are twofold. First, there is a density limitation imposed by lithographic constraints and the relatively large area taken up by conventional control electronics. Second, there is a speed limitation due to the control electronics. The use of high-resolution technologies such as scanning probe microscopy (SPM) for the fabrication of PRAMs reduces the limitation on minimum feature size of a PRAM cell by at least an order of magnitude compared to what can presently be achieved with conventional lithography. The use of SPM also allows fabrication of memory elements with a form factor that will greatly increase output and reduce drive currents.

The second limitation, i.e., the speed of the control electronics, is addressed via the application of the all-metal spin transistor to a GMR array. According to the invention, perpendicular GMR PRAM elements with all-metal spin transistors offer much higher density and faster readout than either AMR designs or in-plane GMR designs.

A GMR memory requires various auxiliary peripheral electronics. These include a word-selection matrix to send a word current pulse down the desired word line during write and read operations, a digit-selection matrix to send a digit current pulse down a desired digit line during a write cycle, and a sense-selection matrix to send a signal from a desired sense line to a sense amplifier. These electronic arrays may comprise conventional silicon devices. In that case, the PRAM elements are fabricated on a silicon chip having the selection transistors already in place. However, there is another option in which the selection electronics are themselves fabricated from GMR material. As a result, the selection electronics may be deposited at the same time as the GMR memory elements, thus saving a large number of masks and fabrication steps. One such GMR device is the spin transistor.

B. All-Metal (GMR) Spin Transistor.

The all-metal spin transistor is an entirely new kind of switching device [M. Johnson, IEEE Spectrum 31 No. 5 (1994)47]. It is a variant of a conventional bipolar transistor, in that it relies on two different carriers. However, where the carriers for silicon bipolar transistors are electrons and holes, i.e., carriers having different electric charge, the two carrier populations for the metal transistor are both electrons— distinguished by their spin alignments. Generically, it is a giant magnetoresistive element whose emitter and collector layers are ferromagnetic films, and whose base layer is a nonmagnetic metal. Its output is adjusted by changing the angle between the two magnetizations, i.e., by switching one of the two films so their relative orientations change between parallel and antiparallel alignments. Because its characteristics will improve as its dimensions shrink, and because submicron lithographic techniques can readily be applied to its fabrication, it is expected that it can be made qualitatively smaller than semiconductor bipolar transistors; as much as 100 times as dense. Its switching time is projected in the 1–10 ns range, substantially the same as that for a GMR PRAM storage element. Therefore, the replacement of conventional control electronics by all-metal transistors offers the potential of reducing the size and switching speed of a PRAM cell to the point where the characteristics of speed and density become limited by the characteristics of the storage element itself. Additionally, it greatly simplifies the PRAM manufacturing process as explained below.

There is a huge advantage in using all-metal spin transistors for the PRAMs of the present invention because they can be fabricated at the same time on the same chips as the other functional PRAM elements. No additional metallizations, doping, or additional process steps at high temperature are required. The whole memory, selection electronics and all, is deposited on the same substrate at the same time, with no added deposition steps or processes. For example, the PRAM designs shown in FIGS. 5–11 may be fabricated using standard thin-film planar processing, micromachining, lithography, integrated circuits and magnetoresistive materials. Replacement of semiconductor transistors with spin transistors simplifies PRAM fabrication on at least two counts. For one, it eliminates the potential complications that may arise in combining semiconductor and magnetic materials on the same substrate in the fabrication process. It also opens the door to mass manufacture of PRAMs by the so-called "webbing" process, which does not lend itself to semiconductor fabrication.

The GMR spin transistor in a PRAM is preferably made of the same materials as the storage/readout element, but it does not necessarily have the same structure. The coercivities of the magnetic layers are preferably similar to those of the storage/readout elements. It will be understood that the use of GMR spin transistors in the manner described represents only one way to implement the support electronics of the PRAM, and that the present invention is not limited to such implementations.

C. Ultradense Terabit PRAM.

Collectively, replacement of conventional lithographic and microfabrication techniques by the very highest-resolution technologies available to deposit and pattern lines and storage/readout elements directly on the substrate, and replacement of silicon-based transistors by all-metal spin transistors will result in even more compact (10 Gbit/cm$^2$ to 1 Tbit/cm$^2$) and faster (<10 ns) PRAMs.

Figure 12A:
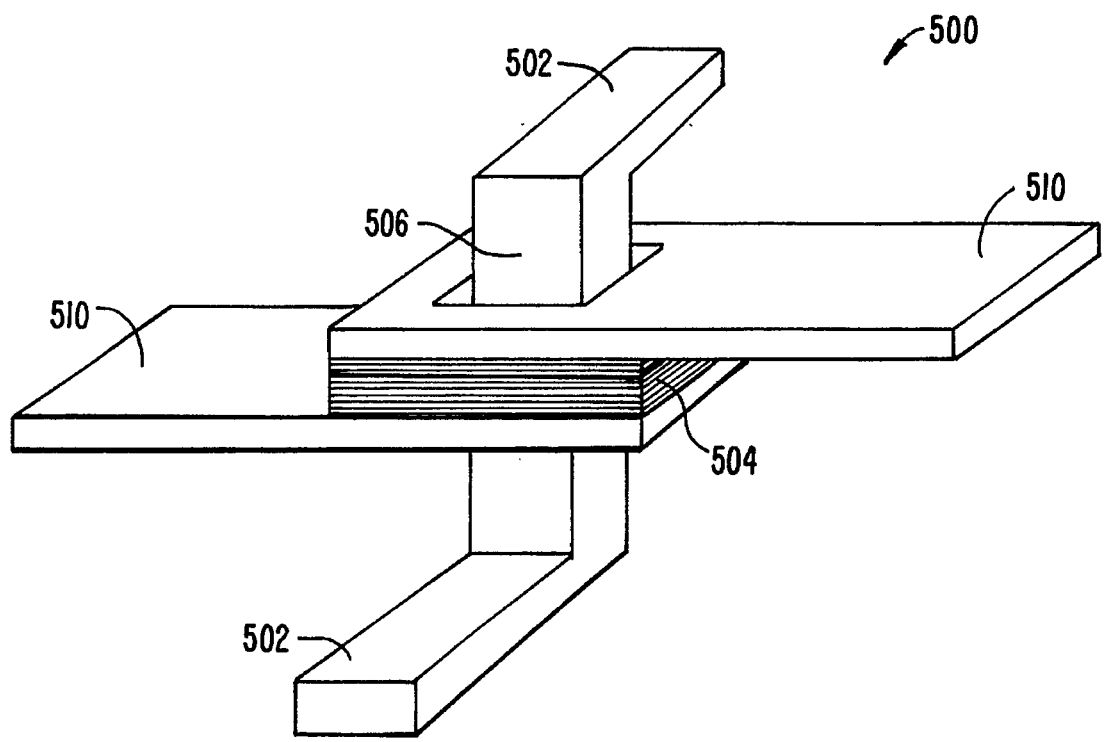
FIG. 12 shows a normal view (b) and a partially exploded view (a) of a closed-flux GMR PRAM cell for an ultradense terabit memory.
Figure 12B:
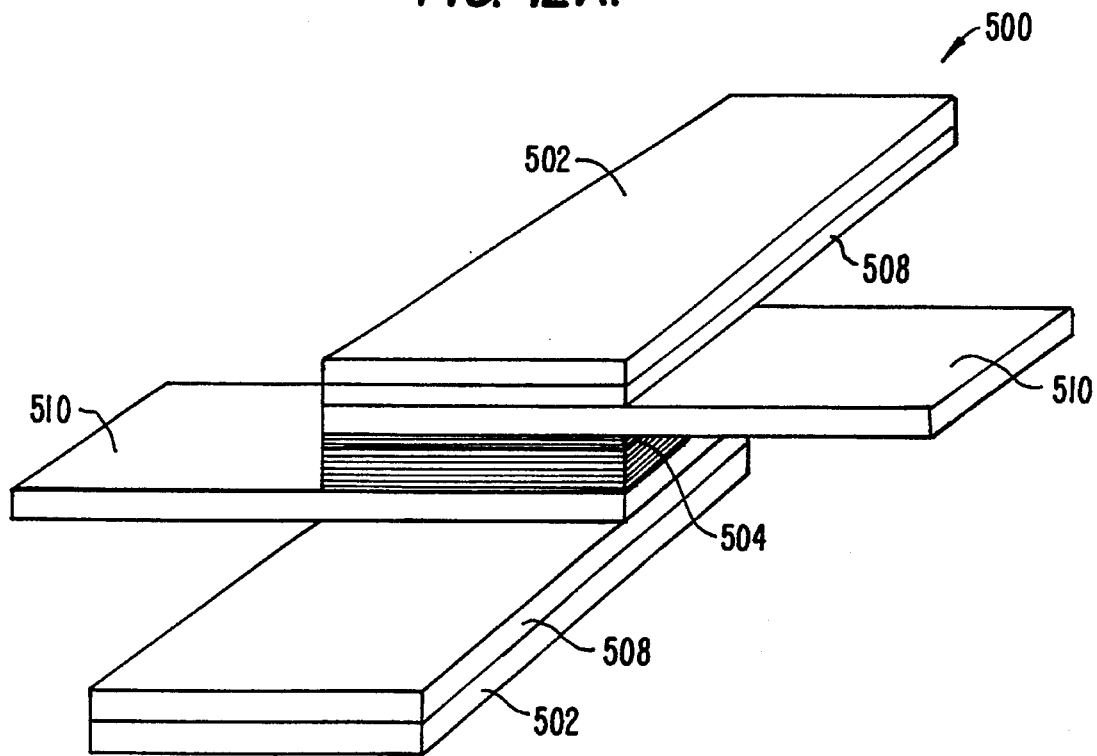

The conceptual design of a PRAM cell 500 for an ultradense terabit memory is shown in FIGS. 12(*a*) and 12(*b*). FIG. 12(*a*) shows a quasi-exploded view of PRAM cell 500 which more clearly shows how word line 502 is coupled through GMR storage film 504 via insulated pillar section 506. FIG. 12(*b*) shows a nonexploded view with insulation 508. The closed-flux GMR combined storage/readout film 504 is switched by the coincidence of current in word line 502 and current in sense/digit line 510. The latter actually goes through the GMR film. The former is insulated from the GMR film. The memory shown is 2D, coincident current, and bit organized. In this embodiment, as contrasted with the embodiments of FIGS. 5 and 6, the digit line and the sense line are combined into a single sense/digit line.

Figure 13:
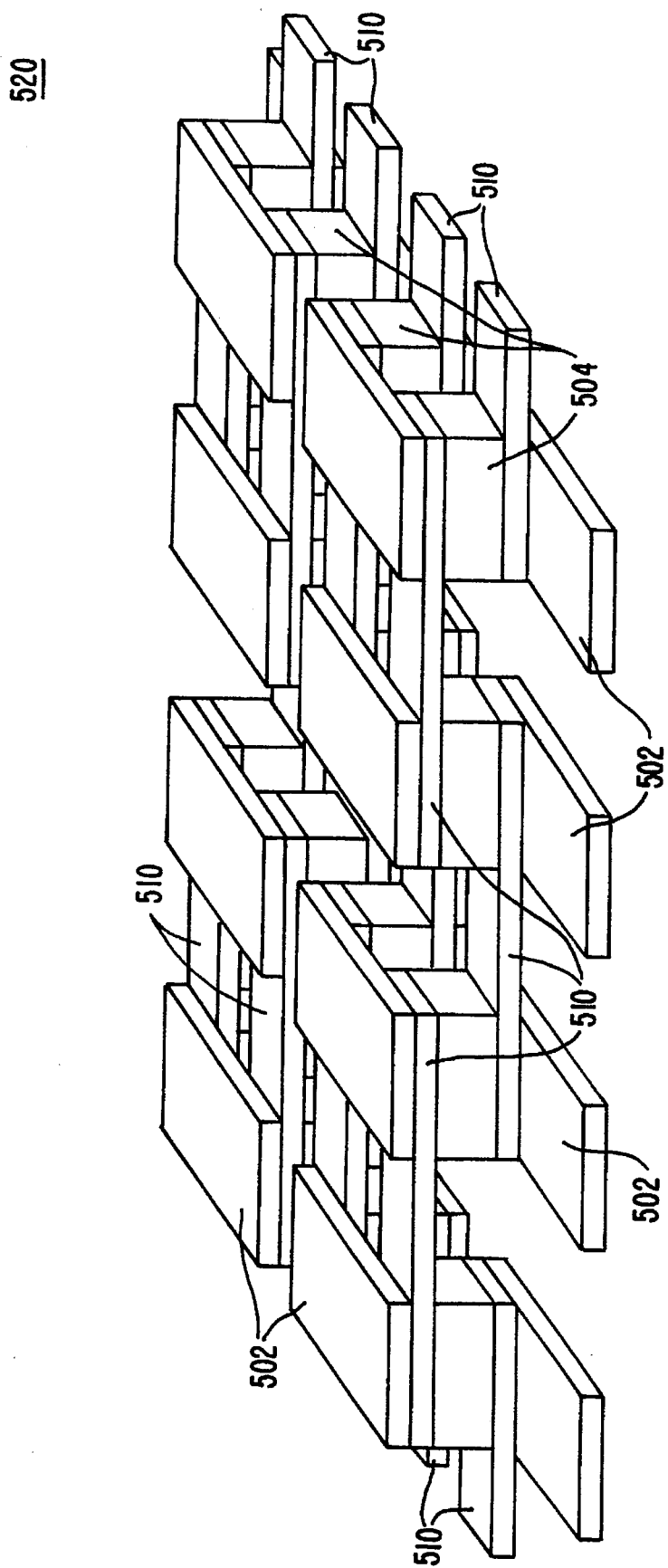
FIG. 13 shows an array of sixteen of the GMR PRAM elements of FIG. 12.
Figure 14:
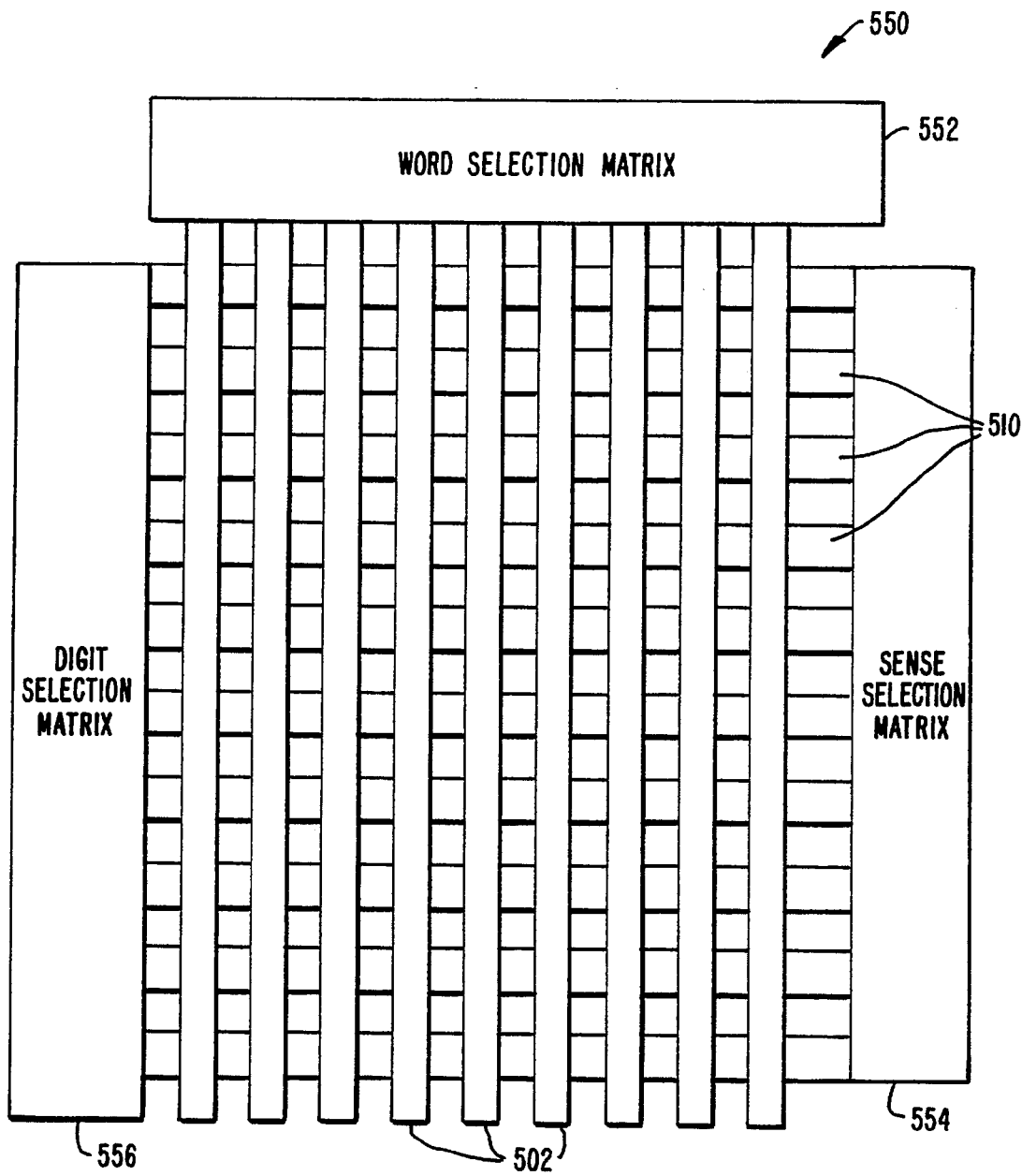
FIG. 14 shows a GMR PRAM module designed according to one embodiment of the present invention.

An array 520 of sixteen memory cells 500 is shown in FIG. 13. Of course a terabit memory will have many more lines in each module. At the end of word lines 502 are a word-current driver and a word-selection matrix (not shown), and at the ends of sense/digit lines 510 are a sense amplifier and a sense-selection matrix (low-level gates; not shown) at one end and a digit-selection matrix at the other end (also not shown). A GMR PRAM module 550 showing word lines 502, sense/digit lines 510 and selection matrices 552, 554, and 556 is shown in FIG. 14. Conventional AMR memories have 32 memory elements on each sense line. Because GMR elements have so much larger output, the number of elements per sense/digit line will be larger by a factor of at least 10. Dummy lines are used to cancel noise.

Readout is done as with in-plane GMR PRAM. The word current is sent along the selected word line, causing a change in the magnetization vector of the permalloy layer of each bit along the word line. The higher-coercivity cobalt layers are not disturbed. A single sense/digit line is selected, and the signal on that line only is sent through the low-level gates to the sense amplifier for that module. Thus the sense amplifier sees only the signal from just the one bit that lies at the intersection of the selected word line and the selected sense/digit line.

The GMR PRAM elements shown in FIGS. 12–14 are exceedingly compact, integrated, fast, and can be expected to perform as reliably as the magnetic core memories that were once part of every computer. Like the old cores, these PRAM elements have perfect flux closure, and get better and faster and require less current as they get smaller. It is important to realize, however, that unlike the old core memories (i) there is no density limitation to a PRAM array other than that imposed by lithography technology, (ii) the output does not shrink with size because it is not flux dependent, and (iii) the readout is nondestructive. The output of a PRAM is due to giant magnetoresistance as current passes through the memory element. This output is a fractional change of the total resistance and is independent of the size of the memory element as long as the form factor stays the same. The conductors and memory of the design in FIGS. 12–14 are metals and do not have the carrier limitations of conventional semiconductors. These PRAM elements thus keep all the good features of old cores and eliminate their undesirable limiting features. They are effectively "supercores". In short, this PRAM design is uniquely suited for a fast, inexpensive, random-access, compact, quickly-alterable, rugged, nonvolatile, terabit memory.

VIII. Fabrication

In general, a giant magnetoresistive film requires careful design and fabrication techniques to work as part of a PRAM information cell. The large-coercivity layer must have coercivity low enough to be switched by the field from a combination of current in the word and digit lines, and high enough not to be switched by a word or digit pulse alone. For maximum signal, the high-coercivity layer must not begin to switch below the level required for all the low-coercivity layers to switch. To this end, a high-coercivity nonconducting magnetic oxide layer is sometimes deposited on a substrate before the first cobalt layer to raise the minimum coercivity of the cobalt. Likewise, another such layer is sometimes deposited on the last cobalt layer of the structure. The nonmagnetic metallic layer must be thick enough so that the exchange coupling is sufficiently weak to enable the two magnetic layers to switch independently; and not so thick as to short out the film signal by lowering the resistance of the whole structure.

A. Fabrication Process

A process for fabricating the memory cells comprising giant magnetoresistive film is now described. The films may be fabricated by sputtering or evaporation, both well known techniques. It is highly preferable to deposit the giant magnetoresistive film onto a flat and unbroken substrate surface, rather than onto the stepped surfaces of etched drive lines. For this reason, and as described with reference to FIG. 8, the portions of the drive lines on the bottom of the magnetic core elements are preferably larger than the core elements themselves. Moreover, in this embodiment, the upper portion of the drive lines connects to the bottom portion through the center of the core element.

In the fabrication process, the bottom portion of the word lines are laid down first. Thereafter, an insulation layer is applied. Etching of these two layers is then carried out. Next, the bottom portion of the digit line is deposited and thereafter etched. Following the bottom portion of the digit lines another insulating layer is deposited.

At this point it is preferable to put the cores down. Each of the core elements is positioned on a broad table defined by the intersection of the previously laid down two bottom conductor layers. Next, holes to the bottom layers are etched in the center of the core elements. Thereafter, the upper portion of the drive lines are fabricated, establishing connection to the bottom portion through the etched holes in the core elements. In this preferred fabrication process, at this point there are seven deposition steps, depositing four metal layers and three insulating layers on a substrate surface.

B. Avoiding Demagnetizing Fields

As discussed above, it is important in the design of memory cells of the present invention that the flux structure be closed and remain closed at all times during all stages of the operation of the memory. An open structure results in incomplete switching, and potentially causes loss of information through magnetization creep, in essence a slow switching process. Neighboring bits may contribute to magnetization creep if the flux structure is not substantially closed. While prior film memories are designed in a closed flux in one dimension (due to the width of drive lines), they are typically open in the other direction. It is when the magnetization field is rotated into the second dimension that the demagnetizing field initiates memory destruction. According to the design of the present invention, the magnetization of the memory cells is not rotated into the second dimension and therefore the memory cells designed according to the present invention do not exhibit magnetization creep and its associated problems.

It will be understood that with the memory cells of this invention, the current can flow normal to the film or in the plane of the film. In general, the change in resistance, i.e., the GMR effect, is larger in the former than in the latter case, so in principle the case of normal flow is a preferable configuration for a readout element. However, if the width of a memory element is many times larger than its thickness, the resistance normal to the plane is inconveniently small, and it may be difficult to get a good readout signal. This difficulty can be overcome with sufficiently fine lithography which allows fabrication of elements with a more favorable form factor, i.e., elements whose width is comparable to their thickness. It is then possible to realize storage/readout elements with sufficiently large resistance to achieve a good readout signal and a much larger change in resistance, thereby allowing signals from a "one" and a "zero" to be clearly distinguished.

The utilization of material displaying giant magnetoresistance in the present invention necessitates several important choices in the design of the memory cells. First, the nonmagnetic conductors should have a thickness less than the mean free path of the electrons. If in-plane operation is chosen, the shunting effect of the intermediate layer is important. However there are other complications and opportunities. There is a superexchange between the two magnetic layers that couples the spins in the two layers. The strength of the coupling depends on the thickness of the separating layer, becoming smaller as the thickness increases. Moreover, the sign of the coupling is an oscillating function of the separation distance, so the coupling is ferromagnetic for some separations and antiferromagnetic for others. This was shown experimentally by Parkin et al. who fabricated films with varying separations between layers and found that the coupling reversed sign four times as a function of separation distance.

Also, there is a choice of any combination of ferromagnetic coupling or antiferromagnetic coupling. Nondestructive readout may be implemented by repetitively changing the magnetization in one of the layers so that it oscillates between being magnetized parallel and antiparallel to that of the other magnetic layer; such repetitive nondestructive readout improves the signal-to-noise ratio.

Composition of the magnetic layers is also important. The composition of the magnetic layers should have a large ratio of up to down spin electrons. For example, pure nickel would be a poor choice. The composition should also have zero magnetostriction, large grain size, and moderate to low anisotropy. For repetitive nondestructive readout, the coercivity of the top magnetic layer should be different than that of the bottom layer and the exchange coupling between the two magnetic layers should be sufficiently large to cause the switched layer to return to its original state when the read current is removed, so that the orientation of one layer remains the same during readout while that of the other oscillates repetitively.

The magnetic layers should be different in order to be most useful for readout. One layer is a storage element, and the other layer is a readout element. An applied read current would switch the readout layer but not the storage layer. Furthermore, there is an option to use the line that supplies the current for magnetoresistive sensing as both a digit line that supplies the half-select field during switching, and a sense line for detecting the signal during read.

IX. Representative Applications

The unique characteristics of the nonvolatile memory array described herein lends itself to, and has direct value in, numerous high-speed data storage and retrieval systems. In general, PRAM has applications in main memory and in mass storage, across the board in such digital systems as computers, recorders, controllers, and in all the industries these devices serve. A partial list of specific applications includes the following.

A primary use is with computer applications requiring significant data storage and maximum access speed. An example would be artificial-intelligence processes with decision-making requirements, such as guidance systems. Another important example is robotic systems which require sensory input and quick response actions. Any computational application benefiting from high-speed and parallel access from nonvolatile memory will benefit from this component. An example of this would be field communications systems and controllers that may experience sudden, random power loses. Typically, digital communications controllers require maximum bandwidth.

There is also application to real-time systems which access significant amounts of stored data, which typically are attended by a party requiring immediate feedback (for example, a surgeon at the operating table), and for which maximum access speed in real time is therefore essential. The PRAM combination of nonvolatility and RAM-like speed is critical for such applications.

In any disk-intensive application—such as database searches, graphics, and most business computer applications—positioning time represents a significant portion of I/O. For all such applications, storage based on the GMR PRAM array herein reduces the time required for I/O by several orders of magnitude, with an attendant improvement in overall computing speed. More generally, the GMR PRAM is vastly superior to disk and tape systems on five counts: orders-of magnitude faster data-access time, significantly greater resistance to shock and vibration, higher reliability, maintenance-free operation, and the absence of head crashes.

The memory system's relatively small volume and weight, coupled with its high speed for random access and permanent storage, makes the present invention ideal for portable computers where the PRAM's nonvolatility will eliminate the need for backup batteries.

The PRAM of the present invention is unique in its potential capability to combine the nonvolatility and substantially unlimited number of erasure cycles of magnetic storage with the ruggedness and access speed of semiconductor memory. The projected characteristics of PRAM are compared in Table 1 with the properties of four commercially available semiconductor memories: static RAM (SRAM); dynamic RAM (DRAM); and FLASH, a product name applied to application-optimized EPROM (erasable programmable read only memory). The PRAM is seen to have projected write and read speeds approaching those of SRAM and low power dissipation. Unlike the high speed dynamic technologies, PRAM is nonvolatile and therefore does not require standby power. Unlike FLASH, the only one of the other memories considered that is nonvolatile, PRAM has an unlimited number of write cycles. FLASH does provide high density at low power, but it has a very long write time, and is not fully bit alterable, i.e., it does not support random access.

TABLE 1

Comparison of some properties of semiconductor memories and PRAMs

| Type | Speed (ns) Write Read | | Density (Mb/cm$^2$) | Power (W/Mb) | Stdby Power (mW/Mb) | Number of write cycles | Nonvolatile | Fully bit alterable |
|---|---|---|---|---|---|---|---|---|
| SRAM | 12 | 12 | 1.00 | 0.70 | 250 | unlimited | no | yes |
| DRAM | 60 | 60 | 3.34 | 0.35 | 10 | unlimited | no | yes |
| FLASH[1] | 16,000 | 120 | 6.67 | 0.15 | 0 | 100,000 | yes | no |
| PRAM[2] | 20 | 20 | 52.0 | 0.10 | 0 | unlimited | yes | yes |

[1] The parameters for FLASH correspond to one of several architectures. The 16 μs in the write entry is the lower end of a range that can extend to tens of milliseconds.
[2] PRAM speed for the GMR-based design comprises an expected storage-film switching speed of 10 ns plus 10 ns for conventional control electronics. PRAM density is based on use of photolithography and on the design shown in FIG. 9 with a minimum feature size of 0.2 μm and a 1.2 μm × 1.6 μm cell size.

Table 2 compares the PRAM (Permanent Random Access Memory) disclosed herein with other memory systems.

TABLE 2

Comparative Properties of Writable Storage Devices With Long-Term Data Retention

| Property | | | Disk[1] | EAROM[2] EEROM[3] | CCD[4] | MBM[5] | PRAM[6] |
|---|---|---|---|---|---|---|---|
| Mechanical motion | | | Yes | No | No | No | No |
| Reliability of long-term data-retention | | | High | Low | Low | High | High |
| Access | | | Serial | Random | Serial | Serial | Random |
| Sensitivity to shock and vibration | | | High | Low | Low | Moderate | Low to Moderate |
| Maintenance-free operation | | | No | Yes | Yes | Yes | Yes |
| Access time per bit | ) for ( | Kbits Mbits Gbits | Long Moderate Short | Short Short Short | Long Moderate Short | Long Moderate Short | Short Short Short |

[1]Mechanical Disk-Drive System
[2]Electrically Alterable Read-only Memory (EAROM)
[3]Electrically Erasable Read-only Memory (EEROM)
[4]Charge-Coupled Device (CCD)
[5]Magnetic Bubble Memory (MBM)
[6]Permanent Random-Access Memory (PRAM)

X. Conclusion

The above description is illustrative and not restrictive. Many variations of the invention will become apparent to those of skill in the art upon review of this disclosure. Merely by way of example, different transducer types may be utilized without departing from the scope of the invention herein. The scope of the invention should, therefore, be determined not with reference to the above description, but instead should be determined with reference to the appended claims along with their full scope of equivalents.

What is claimed is:

1. A memory cell comprising a storage element having a first structure, the first structure having a plurality of layers, selected layers having magnetization vectors associated therewith, the first structure exhibiting giant magnetoresistance, wherein the storage element has a closed flux structure in at least one dimension, and wherein the magnetization vectors are substantially confined to the at least one dimension during all stages of operation of the storage element.

2. The memory cell of claim 1 wherein the plurality of layers comprises a first number of ferromagnetic layers alternating with a second number of nonmagnetic conducting layers, the second number being at least one less than the first number, the magnetization vectors being associated with the ferromagnetic layers.

3. The memory cell of claim 2 wherein the first number of ferromagnetic layers comprises at least a first layer having a first coercivity and at least a second layer having a second coercivity, the second coercivity being greater than the first coercivity.

4. The memory cell of claim 3 wherein at least one second layer is in contact with an oxide layer, thereby raising a switching threshold of the at least one second layer.

5. The memory cell of claim 1 wherein a first layer of the storage element is for storage of information and a second layer of the storage element is for nondestructive readout of the information.

6. The memory cell of claim 1 wherein the first structure comprises a plurality of legs, one of the legs being a multilayer structure exhibiting giant magnetoresistance, each magnetic layer of the multilayer structure having a square-loop structure.

7. The memory cell of claim 1 wherein the first structure comprises a multilayer toroidal structure exhibiting giant magnetoresistance.

8. The memory cell of claim 1 further comprising:

means for reading information from and writing information to the first structure; and a selection conductor for applying a selection signal to the storage element to enable reading from and writing to the first structure.

9. The memory cell of claim 8 wherein the reading and writing means comprise a read conductor electrically coupled to the first structure, and a write conductor electrically isolated from the read conductor and the first structure.

10. The memory cell of claim 8 wherein the reading and writing means comprise a single conductor electrically coupled to the first structure.

11. The memory cell of claim 8 wherein the reading and writing means comprise a digit line, and the selection conductor comprises a word line, information being stored in the first structure in a region where the word line is parallel to the digit line.

12. A device for storing information comprising:

an array of storage elements arranged in columns and rows, each storage element comprising, a first structure having a plurality of layers, selected layers having magnetization vectors associated therewith, the first structure exhibiting giant magnetoresistance, wherein each storage element has a closed flux structure in at least one dimension, and wherein the magnetization vectors are substantially confined to the at least one dimension during all stages of operation of the storage element;

a plurality of read and write conductors for reading information from and writing information to the array of storage elements, each read and write conductor being for reading from and writing to a particular row of storage elements; and a plurality of selection conductors for applying selection signals to the array of storage elements, each selection conductor being for selecting a particular column of storage elements and enabling reading from and writing to the storage elements of the particular column;

wherein random access to any of the storage elements may be effected by the concurrence of signals on corresponding ones of the read and write conductors and the selection conductors.

13. The array of claim 12 wherein the plurality of layers in each storage element comprises a first number of ferromagnetic layers alternating with a second number of non-magnetic conducting layers, the second number being at least one less than the first number, the magnetization vectors being associated with the ferromagnetic layers.

14. The array of claim 13 wherein the first number of ferromagnetic layers comprises at least a first layer having a first coercivity and at least a second layer having a second coercivity, the second coercivity being greater than the first coercivity.

15. The array of claim 14 wherein at least one second layer is in contact with an oxide layer, thereby raising a switching threshold of the at least one second layer.

16. The array of claim 12 wherein for each storage element, a first layer is for storage of information and a second layer is for nondestructive readout of the information.

17. The array of claim 12 wherein the first structure of each storage element comprises a square-loop structure having a plurality of legs, one of the legs being a multilayer structure exhibiting giant magnetoresistance.

18. The array of claim 12 wherein the first structure of each storage element comprises a multilayer toroidal structure exhibiting giant magnetoresistance.

19. The array of claim 12 wherein the plurality of read and write conductors comprises a plurality of read conductors and a plurality of write conductors, wherein each row of storage elements has a read conductor and a write conductor associated therewith, the read conductor of a particular row being electrically coupled to the first structures of the storage elements in the particular row, and the write conductor associated with the particular row being electrically isolated from the first structures of the storage elements in the particular row and from the read conductor associated with the particular row.

20. The array of claim 12 wherein the plurality of read and write conductors comprises a plurality of dual-purpose read/write conductors, wherein each row of storage elements has a read/write conductor associated therewith, the read/write conductor of a particular row being electrically coupled to the first structures of the storage elements in the particular row.

21. The array of claim 12 further comprising support electronics wherein the support electronics are all-metal devices.

22. The array of claim 21 wherein the support electronics comprise a plurality of giant magnetoresistive all-metal spin transistors.

23. A method for nondestructively reading a storage element, the storage element comprising a first structure having a plurality of layers, selected layers having magnetization vectors associated therewith, the first structure exhibiting giant magnetoresistance, the storage element further comprising a read conductor for reading from the first structure, and a select conductor for applying a select signal to the storage element to enable reading from the first structure, wherein the storage element has a closed flux structure in at least one dimension, and the magnetization vectors are substantially confined to the at least one dimension during all stages of operation of the storage element, the method comprising the steps of:

applying a select signal to the storage element via the select conductor, thereby changing the orientation of at least a first magnetization vector, the orientation of at least a second magnetization vector remaining unchanged; and detecting a change in resistance on the read conductor.

24. The method of claim 23 wherein the step of applying a select signal comprises changing the orientation of the at least a first magnetization vector a plurality of times, the orientation of the at least a first magnetization vector oscillating between being parallel and antiparallel to the at least a second magnetization vector.

25. A method for writing to a storage element, the storage element comprising a first structure having a plurality of layers, selected layers having magnetization vectors associated therewith, the first structure exhibiting giant magnetoresistance, the storage element further comprising a write conductor for writing to the first structure, and a select conductor for applying a select signal to the storage element to enable writing to the first structure, wherein the storage element has a closed flux structure in at least one dimension, and the magnetization vectors are substantially confined to the at least one dimension during all stages of operation of the storage element, the method comprising the steps of:

applying a select signal to the storage element via the select conductor; and applying a write signal concurrently with the application of the select signal, thereby establishing a desired orientation of at least a first magnetization vector, the desired orientation persisting after the write signal is removed.

26. A thin-film memory cell, comprising:

a multilayer thin-film storage element exhibiting giant magnetoresistance, the storage element having a top, a bottom, an aperture therethrough, and a magnetization around the aperture;

a thin-film word line passing through the aperture, the thin-film word line being electrically isolated from the thin-film storage element; and a segmented thin-film sense/digit line having two segments coupled to the thin-film storage element such that current flowing through the thin-film sense/digit line passes through the thin-film storage element, the sense/digit line exhibiting a resistance which depends on orientations of magnetization vectors in the multilayer thin-film storage element;

wherein the magnetization in the thin-film storage element is switched from a clockwise direction around the aperture to a counterclockwise direction around the aperture and from a counterclockwise direction around the aperture to a clockwise direction around the aperture in response to a coincidence of current in the segmented sense/digit line and the word line, the magnetization of the thin-film storage element having a closed flux orientation during substantially all stages of operation of the thin-film storage element.

27. The thin-film memory cell of claim 26 wherein the thin-film storage element is a multilayer film comprising low-coercivity magnetic layers separated from high-coercivity magnetic layers by non-magnetic conducting layers.

28. A thin-film memory cell, comprising:

a multilayer thin-film storage element exhibiting giant magnetoresistance, the storage element having an aperture therethrough, and a magnetization around the aperture;

a thin-film word line passing through the aperture, the thin-film word line being electrically isolated from the thin-film storage element;

a thin-film digit line passing through the aperture, the thin-film digit line being electrically isolated from the thin-film storage element; and a segmented thin-film sense line having two segments coupled to the thin-film storage element such that current flowing through the thin-film sense line passes through the thin-film storage element, the sense line exhibiting a resistance which depends on orientations of magnetization vectors in the multilayer thin-film storage element;

wherein the magnetization in the thin-film storage element is switched from a clockwise direction around the aperture to a counterclockwise direction around the aperture and from a counterclockwise direction around the aperture to a clockwise direction around the aperture in response to a coincidence of current in the digit line and the word line, the magnetization of the thin-film storage element having a closed flux orientation during substantially all stages of operation of the thin-film storage element.

29. A thin-film memory cell, comprising:

a multilayer thin-film storage element exhibiting giant magnetoresistance;

a thin-film word line deposited on top of the thin-film storage element and electrically isolated therefrom;

a serpentine thin-film digit line deposited on top of the thin-film word line and parallel to the thin-film word line in an area over the thin-film storage element, the thin-film digit line being electrically isolated from both the thin-film storage element and the thin-film word line;

a keeper element of magnetic material deposited on top of the thin-film storage element, the thin-film word line, and the thin-film digit line, the keeper element being electrically isolated from the thin-film word line and the thin-film digit line; and a segmented thin-film sense line having two segments coupled to the thin-film storage element such that current flowing through the thin-film sense line passes through the thin-film storage element, the sense line exhibiting a resistance which depends on orientations of magnetization vectors in the multilayer thin-film storage element;

wherein the magnetization in the thin-film storage element is switched from a clockwise direction around the word and digit lines to a counterclockwise direction around the word and digit lines and from a counterclockwise direction around the word and digit lines to a clockwise direction around the word and digit lines in response to a coincidence of current in the digit line and the word line, the magnetization of the thin-film storage element having a closed flux orientation during substantially all stages of operation of the thin-film storage element.

30. The thin-film memory cell of claim 29 wherein the thin-film storage element and the keeper element each comprise a multilayer structure exhibiting giant magnetoresistance, the keeper element being electrically coupled to the thin-film storage element.

31. The thin-film memory cell of claim 29 wherein the thin-film digit line is electrically coupled to the thin-film sense line thereby forming a dual purpose digit-sense line.

32. A storage element comprising a first structure having a plurality of layers, selected layers having magnetization vectors associated therewith, the first structure exhibiting giant magnetoresistance, wherein the storage element has a closed flux structure in at least one dimension, and wherein the magnetization vectors are substantially confined to the at least one dimension during all stages of operation of the storage element.

33. A memory cell comprising a magnetic storage element having at least one magnetization vector associated therewith, and a sensing element having a first structure, the first structure having a plurality of layers, selected layers also having magnetization vectors associated therewith, the first structure exhibiting giant magnetoresistance, wherein the memory cell has a closed flux structure in at least one dimension, and wherein the magnetization vectors of the magnetic storage element and the sensing element are substantially confined to the at least one dimension during all stages of operation of the memory cell.

34. The memory cell of claim 33 further comprising a word line, and a digit line, the word and digit lines being parallel in an area adjacent the magnetic storage element.

35. A thin-film memory cell comprising:

a multilayer thin-film storage element exhibiting giant magnetoresistance, the storage element being characterized by a magnetization, and having a region associated therewith;

a thin-film sense line electrically connected to the storage element such that current in the sense line flows through the storage element;

a thin-film digit line; and a thin-film word line electrically isolated from the storage element and the digit line, the word line being oriented substantially parallel to the digit line in the region of the storage element;

wherein the magnetization in the storage element is switched from a clockwise direction around the word and digit lines to a counterclockwise direction and from the counterclockwise direction around the word and digit lines to the clockwise direction in response to a coincidence of current in the word and digit lines, the magnetization being confined to a closed flux structure during all stages of operation of the memory cell.

36. The thin-film memory cell of claim 35 wherein the digit line is in electrical contact with the sense line thereby forming a dual purpose sense/digit line.

37. The thin-film memory cell of claim 35 further comprising a deposited keeper element comprising a multilayer structure exhibiting giant magnetoresistance.

38. The thin-film memory cell of claim 35 further comprising a deposited keeper element electrically coupled to the word line thereby forming a dual-purpose keeper/word line.

39. The thin-film memory cell of claim 35 further comprising a deposited keeper element electrically coupled to the multilayer storage element and electrically isolated from the word line.

40. The thin-film memory cell of claim 35 further comprising a deposited keeper element, wherein the digit line and the word line are sandwiched between the multilayer storage element and the keeper element.

41. A memory cell comprising a storage element having a first structure, the first structure having a plurality of layers, selected layers having magnetization vectors associated therewith, the first structure exhibiting giant magnetoresistance, wherein the storage element has a closed flux structure in at least one dimension, and wherein upon application of a half-select current the magnetization vectors of the storage element are substantially confined to the at least one dimension.

42. The memory cell of claim 41 wherein the plurality of layers comprises a first number of ferromagnetic layers alternating with a second number of nonmagnetic conducting layers, the second number being at least one less than the first number, the magnetization vectors being associated with the ferromagnetic layers.

43. The memory cell of claim 42 wherein the first number of ferromagnetic layers comprises at least a first layer having a first coercivity and at least a second layer having a second coercivity, the second coercivity being greater than the first coercivity.

44. The memory cell of claim 43 wherein at least one second layer is in contact with an oxide layer, thereby raising a switching threshold of the at least one second layer.

45. The memory cell of claim 41 wherein a first layer of the storage element is for storage of information and a second layer of the storage element is for nondestructive readout of the information.

46. The memory cell of claim 41 wherein the first structure comprises a plurality of legs, one of the legs being a multilayer structure exhibiting giant magnetoresistance, each magnetic layer of the multilayer structure having a square-loop structure.

47. The memory cell of claim 41 wherein the first structure comprises a multilayer toroidal structure exhibiting giant magnetoresistance.

48. The memory cell of claim 41 further comprising:

means for reading information from and writing information to the first structure; and a selection conductor for applying a selection signal to the storage element to enable reading from and writing to the first structure.

49. The memory cell of claim 48 wherein the reading and writing means comprise a read conductor electrically coupled to the first structure, and a write conductor electrically isolated from the read conductor and the first structure.

50. The memory cell of claim 48 wherein the reading and writing means comprise a single conductor electrically coupled to the first structure.

51. The memory cell of claim 48 wherein the reading and writing means comprise a digit line, and the selection conductor comprises a word line, information being stored in the first structure in a region where the word line is parallel to the digit line.

52. A device for storing information comprising:

an array of storage elements arranged in columns and rows, each storage element comprising, a first structure having a plurality of layers, selected layers having magnetization vectors associated therewith, the first structure exhibiting giant magnetoresistance, wherein each storage element has a closed flux structure in at least one dimension, and wherein upon application of a half-select current the magnetization vectors of each storage element are substantially confined to the at least one dimension;

a plurality of read and write conductors for reading information from and writing information to the array of storage elements, each read and write conductor being for reading from and writing to a particular row of storage elements; and a plurality of selection conductors for applying selection signals to the array of storage elements, each selection conductor being for selecting a particular column of storage elements and enabling reading from and writing to the storage elements of the particular column;

wherein random access to any of the storage elements may be effected by the concurrence of signals on corresponding ones of the read and write conductors and the selection conductors.

53. The array of claim 52 wherein the plurality of layers in each storage element comprises a first number of ferromagnetic layers alternating with a second number of nonmagnetic conducting layers, the second number being at least one less than the first number, the magnetization vectors being associated with the ferromagnetic layers.

54. The array of claim 53 wherein the first number of ferromagnetic layers comprises at least a first layer having a first coercivity and at least a second layer having a second coercivity, the second coercivity being greater than the first coercivity.

55. The array of claim 54 wherein at least one second layer is in contact with an oxide layer, thereby raising a switching threshold of the at least one second layer.

56. The array of claim 52 wherein for each storage element, a first layer is for storage of information and a second layer is for nondestructive readout of the information.

57. The array of claim 52 wherein the first structure of each storage element comprises a square-loop structure having a plurality of legs, one of the legs being a multilayer structure exhibiting giant magnetoresistance.

58. The array of claim 52 wherein the first structure of each storage element comprises a multilayer toroidal structure exhibiting giant magnetoresistance.

59. The array of claim 52 wherein the plurality of read and write conductors comprises a plurality of read conductors and a plurality of write conductors, wherein each row of storage elements has a read conductor and a write conductor associated therewith, the read conductor of a particular row being electrically coupled to the first structures of the storage elements in the particular row, and the write conductor associated with the particular row being electrically isolated from the first structures of the storage elements in the particular row and from the read conductor associated with the particular row.

60. The array of claim 52 wherein the plurality of read and write conductors comprises a plurality of dual-purpose read/write conductors, wherein each row of storage elements has a read/write conductor associated therewith, the read/write conductor of a particular row being electrically coupled to the first structures of the storage elements in the particular row.

61. The array of claim 52 further comprising support electronics wherein the support electronics are all-metal devices.

62. The array of claim 61 wherein the support electronics comprise a plurality of giant magnetoresistive all-metal spin transistors.

63. A method for nondestructively reading a storage element, the storage element comprising a first structure having a plurality of layers, selected layers having magnetization vectors associated therewith, the first structure exhibiting giant magnetoresistance, the storage element further comprising a read conductor for reading from the first structure, and a select conductor for applying a select signal to the storage element to enable reading from the first structure, wherein the storage element has a closed flux structure in at least one dimension, and wherein upon application of a half-select current the magnetization vectors of the storage element are substantially confined to the at least one dimension, the method comprising the steps of:

applying a select signal to the storage element via the select conductor, thereby changing the orientation of at least a first magnetization vector, the orientation of at least a second magnetization vector remaining unchanged; and detecting a change in resistance on the read conductor.

64. The method of claim 63 wherein the step of applying a select signal comprises changing the orientation of the at least a first magnetization vector a plurality of times, the orientation of the at least a first magnetization vector oscillating between being parallel and antiparallel to the at least a second magnetization vector.

65. A method for writing to a storage element, the storage element comprising a first structure having a plurality of layers, selected layers having magnetization vectors associated therewith, the first structure exhibiting giant magnetoresistance, the storage element further comprising a write conductor for writing to the first structure, and a select conductor for applying a select signal to the storage element to enable writing to the first structure, wherein the storage element has a closed flux structure in at least one dimension, and wherein upon application of a half-select current the magnetization vectors of the storage element are substantially confined to the at least one dimension, the method comprising the steps of:

applying a select signal to the storage element via the select conductor; and applying a write signal concurrently with the application of the select signal, thereby establishing a desired orientation of at least a first magnetization vector, the desired orientation persisting after the write signal is removed.

66. A storage element comprising a first structure having a plurality of layers, selected layers having magnetization vectors associated therewith, the first structure exhibiting giant magnetoresistance, wherein the storage element has a closed flux structure in at least one dimension, and wherein upon application of a half-select current the magnetization vectors are substantially confined to the at least one dimension.

67. A memory cell comprising a magnetic storage element having at least one magnetization vector associated therewith, and a sensing element having a first structure, the first structure having a plurality of layers, selected layers also having magnetization vectors associated therewith, the first structure exhibiting giant magnetoresistance, wherein the memory cell has a closed flux structure in at least one dimension, and wherein upon application of a half-select current the magnetization vectors of the magnetic storage element and the sensing element are substantially confined to the at least one dimension.

68. The memory cell of claim 67 further comprising a word line, and a digit line, the word and digit lines being parallel in an area adjacent the magnetic storage element.

* * * * *